(12) United States Patent
Zeng

(10) Patent No.: US 11,758,784 B2
(45) Date of Patent: Sep. 12, 2023

(54) DISPLAY PANEL AND FABRICATING METHOD THEREOF, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventor: Pingchuan Zeng, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 315 days.

(21) Appl. No.: 17/352,292

(22) Filed: Jun. 19, 2021

(65) Prior Publication Data

US 2022/0140016 A1 May 5, 2022

(30) Foreign Application Priority Data

Oct. 30, 2020 (CN) .......................... 202011188300.9

(51) Int. Cl.
*H10K 59/35* (2023.01)
*H10K 50/81* (2023.01)
(Continued)

(52) U.S. Cl.
CPC .............. *H10K 59/35* (2023.02); *H10K 50/81* (2023.02); *H10K 59/124* (2023.02); *H10K 59/1201* (2023.02)

(58) Field of Classification Search
CPC ...... H10K 59/35; H10K 50/81; H10K 59/124; H10K 59/1201
(Continued)

(56) References Cited

U.S. PATENT DOCUMENTS

| 4,728,581 A * | 3/1988 | Kane ...................... H05B 33/28 428/917 |
| 2016/0254493 A1* | 9/2016 | Sun ....................... H10K 59/123 257/40 |

(Continued)

FOREIGN PATENT DOCUMENTS

| CN | 103996694 A | 8/2014 |
| CN | 203859154 U | 10/2014 |

(Continued)

OTHER PUBLICATIONS

CN202011188300.9 first office action and search report.
CN202011188300.9 second office action and search report.

*Primary Examiner* — Xia L Cross
(74) *Attorney, Agent, or Firm* — IPRO, PLLC

(57) ABSTRACT

A display panel and a fabricating method thereof, and a displaying device. The display panel includes: a thin-film-transistor base plate; a planarization layer, wherein the planarization layer is provided on one surface of the thin-film-transistor base plate; and light emitting devices, wherein the light emitting devices are provided on one side of the planarization layer that is further away from the thin-film-transistor base plate, the light emitting devices include a blue-color light emitting device, a red-color light emitting device and a green-color light emitting device, the blue-color light emitting device includes a first anode, the red-color light emitting device includes a second anode, and the green-color light emitting device includes a third anode; and both of the surface roughness of the first anode and the surface roughness of the second anode are greater than the surface roughness of the third anode.

19 Claims, 6 Drawing Sheets

(51) Int. Cl.
*H10K 59/124* (2023.01)
*H10K 59/12* (2023.01)

(58) Field of Classification Search
USPC .......................................................... 257/72
See application file for complete search history.

(56) References Cited

U.S. PATENT DOCUMENTS

2017/0250233 A1* 8/2017 Ushikubo ............ H10K 59/351
2020/0227669 A1* 7/2020 Guo ...................... H10K 59/35

FOREIGN PATENT DOCUMENTS

| CN | 107170789 A | 9/2017 |
| CN | 107845669 A | 3/2018 |
| CN | 110444579 A | 11/2019 |

* cited by examiner

DISPLAY PANEL AND FABRICATING METHOD THEREOF, AND DISPLAYING DEVICE

CROSS REFERENCE TO RELEVANT APPLICATIONS

The present disclosure claims the priority of the Chinese patent application filed on Oct. 30, 2020 before the Chinese Patent Office with the application number of 202011188300.9 and the title of "DISPLAY PANEL AND FABRICATING METHOD THEREOF, AND DISPLAYING DEVICE", which is incorporated herein in its entirety by reference.

TECHNICAL FIELD

The present disclosure relates to the technical field of displaying, and particularly relates to a display panel and a fabricating method thereof, and a displaying device.

BACKGROUND

AMOLED screens have the advantages such as a wide color gamut, a high resolution, and a capability of separate controlling of each of the pixels, and thus are increasingly extensively applied in terminals. Especially, AMOLED large-size panels are having an increasingly higher market share in the market of terminals, such as large-screen mobile phones, notebook computers and onboard meter displaying.

SUMMARY

The present disclosure provides a display panel and a fabricating method thereof, and a displaying device.

In an aspect of the present disclosure, the present disclosure provides a display panel. According to an embodiment of the present disclosure, the display panel comprises:
- a thin-film-transistor base plate;
- a planarization layer, wherein the planarization layer is provided on one surface of the thin-film-transistor base plate; and
- light emitting devices, wherein the light emitting devices are provided on one side of the planarization layer that is further away from the thin-film-transistor base plate, the light emitting devices include a blue-color light emitting device, a red-color light emitting device and a green-color light emitting device, the blue-color light emitting device comprises a first anode, the red-color light emitting device comprises a second anode, and the green-color light emitting device comprises a third anode;
- wherein both of a surface roughness of one surface of the first anode that is further away from the thin-film-transistor base plate and a surface roughness of one surface of the second anode that is further away from the thin-film-transistor base plate are greater than a surface roughness of one surface of the third anode that is further away from the thin-film-transistor base plate.

According to an embodiment of the present disclosure, the surface roughness of the one surface of the first anode that is further away from the thin-film-transistor base plate is 1.6 nm-2.6 nm, the surface roughness of the one surface of the second anode that is further away from the thin-film-transistor base plate is 1.6 nm-2.6 nm, and the surface roughness of the one surface of the third anode that is further away from the thin-film-transistor base plate is 0.9 nm-1.1 nm.

According to an embodiment of the present disclosure, the display panel further comprises:
- a rough insulating layer, wherein the rough insulating layer is provided on one surface of the planarization layer that is further away from the thin-film-transistor base plate, an orthographic projection of the rough insulating layer on the thin-film-transistor base plate covers orthographic projections of the first anode and the second anode on the thin-film-transistor base plate, and does not have an overlapping region with an orthographic projection of the third anode on the thin-film-transistor base plate, the first anode and the second anode are provided on one surface of the rough insulating layer that is further away from the thin-film-transistor base plate, and the third anode is provided on the one surface of the planarization layer that is further away from the thin-film-transistor base plate.

According to an embodiment of the present disclosure, a surface roughness of the one surface of the rough insulating layer that is further away from the thin-film-transistor base plate is greater than a surface roughness of the one surface of the planarization layer that is further away from the thin-film-transistor base plate.

According to an embodiment of the present disclosure, the surface roughness of the one surface of the rough insulating layer that is further away from the thin-film-transistor base plate is 1.0 nm-2.3 nm, and the surface roughness of the one surface of the planarization layer that is further away from the thin-film-transistor base plate is less than 1.0 nm.

According to an embodiment of the present disclosure, a material of the rough insulating layer is silicon oxide, a thickness of the rough insulating layer is 200 nm-300 nm, and a surface roughness of the silicon oxide is 1.0 nm-1.8 nm.

According to an embodiment of the present disclosure, a material of the rough insulating layer is silicon oxide and silicon nitride, a thickness of the silicon oxide is 200 nm-300 nm, a thickness of the silicon nitride is 80 nm-100 nm, and a surface roughness of the rough insulating layer is 1.2 nm-2.3 nm.

According to an embodiment of the present disclosure, part of the rough insulating layer has one side that contacts the planarization layer and one other side that contacts a pixel defining layer.

According to an embodiment of the present disclosure, the rough insulating layer and the third anode are separated by the pixel defining layer.

According to an embodiment of the present disclosure, the display panel further comprises a first cathode, a second cathode and a third cathode, and upper surfaces of the first cathode, the second cathode and the third cathode are flush.

In another aspect of the present disclosure, the present disclosure provides a method for fabricating the display panel stated above. According to an embodiment of the present disclosure, The method for fabricating a display panel comprises:
- providing the thin-film-transistor base plate;
- forming the planarization layer on the one surface of the thin-film-transistor base plate; and
- forming the light emitting devices on the one side of the planarization layer that is further away from the thin-film-transistor base plate.

According to an embodiment of the present disclosure, before the step of forming the light emitting devices on the one side of the planarization layer that is further away from the thin-film-transistor base plate, the method further comprises:

forming a rough insulating layer on one surface of the planarization layer that is further away from the thin-film-transistor base plate, wherein an orthographic projection of the rough insulating layer on the thin-film-transistor base plate covers orthographic projections of the first anode and the second anode on the thin-film-transistor base plate, and does not have an overlapping region with an orthographic projection of the third anode on the thin-film-transistor base plate;

the first anode and the second anode are formed on one surface of the rough insulating layer that is further away from the thin-film-transistor base plate, and the third anode is formed on the one surface of the planarization layer that is further away from the thin-film-transistor base plate; and a surface roughness of the one surface of the rough insulating layer that is further away from the thin-film-transistor base plate is greater than a surface roughness of the one surface of the planarization layer that is further away from the thin-film-transistor base plate.

According to an embodiment of the present disclosure, the step of forming the rough insulating layer on the one surface of the planarization layer that is further away from the thin-film-transistor base plate comprises:

forming a whole original rough insulating layer on the one surface of the planarization layer that is further away from the thin-film-transistor base plate;

by using a wet-etching process, removing the original rough insulating layer at a position where the green-color light emitting device is required to be formed; and maintaining the original rough insulating layer at positions where the blue-color light emitting device and the red-color light emitting device are required to be formed, to obtain the rough insulating layer.

According to an embodiment of the present disclosure, the rough insulating layer is obtained by depositing silicon oxide, and a rate of the deposition of the silicon oxide is 50 angstroms/second to 100 angstroms/second.

According to an embodiment of the present disclosure, the rough insulating layer is obtained by depositing silicon oxide and silicon nitride, a rate of the deposition of the silicon oxide is 50 angstroms/second to 100 angstroms/second, and a rate of the deposition of the silicon nitride is 800 angstroms/second to 1000 angstroms/second.

According to an embodiment of the present disclosure, the rough insulating layer is formed by chemical vapor deposition or physical vapor deposition.

According to an embodiment of the present disclosure, after the step of forming the rough insulating layer on the one surface of the planarization layer that is further away from the thin-film-transistor base plate, the method further comprises:

by one-step etching, forming a via hole penetrating the planarization layer and the rough insulating layer.

According to an embodiment of the present disclosure, the planarization layer is obtained by spread-coating, leveling and solidifying polyimide, wherein the fabrication temperature of the planarization layer is 250° C.

In yet another aspect of the present disclosure, the present disclosure provides a displaying device. According to an embodiment of the present disclosure, the displaying device comprises the display panel stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

The above and/or additional aspects and advantages of the present disclosure will become apparent and readily understandable from the following description on the embodiments with reference to the drawings. In the drawings.

DETAILED DESCRIPTION

Figure 1:
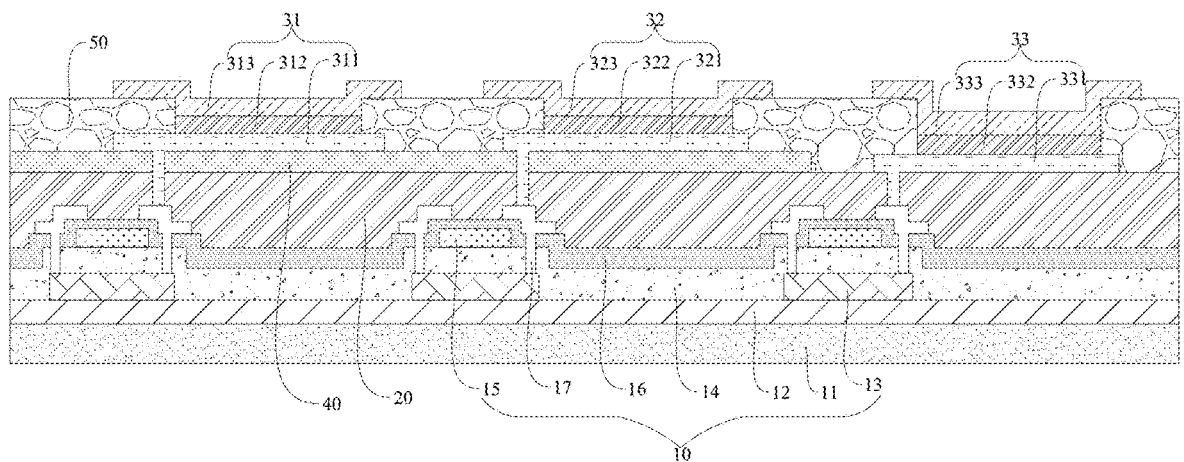
FIG. 1 is a schematic structural diagram of the display panel according to an embodiment of the present disclosure.

The embodiments of the present disclosure will be described in detail below, and the examples of the embodiments are illustrated in the drawings, wherein the same or similar reference numbers throughout the drawings indicate the same or similar elements or elements having the same or similar functions. The embodiments described below with reference to the drawings are exemplary, are intended to interpret the present disclosure, and should not be construed as a limitation on the present disclosure.

In an aspect of the present disclosure, the present disclosure provides a display panel. According to an embodiment of the present disclosure, referring to FIG. 1, the display panel comprises: a thin-film-transistor base plate 10; a planarization layer (PLN) 20, wherein the planarization layer 20 is provided on one surface of the thin-film-transistor base plate 10; and light emitting devices, wherein the light emitting devices are provided on one side of the planarization layer 20 that is further away from the thin-film-transistor base plate 10, the light emitting devices include a blue-color light emitting device 31, a red-color light emitting device 32 and a green-color light emitting device 33, the blue-color light emitting device 31 comprises a first anode 311, the red-color light emitting device 32 comprises a second anode 321, and the green-color light emitting device 33 comprises a third anode 331; and both of the surface roughness of one surface of the first anode 311 that is further away from the thin-film-transistor base plate 10 and the surface roughness of one surface of the second anode 321 that is further away from the thin-film-transistor base plate 10 are greater than the surface roughness of one surface of the third anode 331 that is further away from the thin-film-transistor base plate 10. Accordingly, the first anode of the blue-color light emitting device and the second anode of the red-color light emitting device have higher surface roughnesses, and when light irradiates the surfaces of the first anode and the second anode, the light rays are not reflected out by the surfaces of the first anode and the second anode collectively, which can increase the luminous efficiencies of the first anode of the blue-color light emitting device and the large angles of the red-color light emitting device, and reduce the color cast of the monochromatic light and the color cast of the white light, thereby ameliorating the problem of the large-angle color cast of the display panel. In addition, by increasing the surface roughnesses of the first anode and the second anode, the light emission amount of the green-color light emitting device at large visual angles is reduced, which increases the proportions of the blue light emitted by the blue-color light emitting device and the red light emitted by the red-color light emitting device in the white light, to achieve the goal of improving the large-visual-angle color cast.

The particular structure of the thin-film-transistor base plate 10 is not particularly limited, and may be flexibly selected according to actual situations by a person skilled in the art. In some embodiments, as shown in FIG. 1, the thin-film-transistor base plate 10 comprises: a substrate 11; a buffer layer 12, wherein the buffer layer 12 is provided on one surface of the substrate; an active layer 13, wherein the active layer 13 is provided on one side of the buffer layer that is further away from the substrate base plate; a grid insulating layer 14, wherein the grid insulating layer 14 is provided on sides of the buffer layer 12 and the active layer 13 that are further away from the substrate 11; a grid 15, wherein the grid 15 is provided on one side of the grid insulating layer 14 that is further away from the substrate 11; an inter-layer-medium layer 16, wherein the inter-layer-medium layer 16 is provided on sides of the grid insulating layer 14 and the grid 15 that are further away from the substrate 11; and a source-drain electrode 17, wherein the source-drain electrode 17 is provided on one side of the inter-layer-medium layer 16 that is further away from the substrate 11, and is electrically connected to the active layer 13 by a via hole penetrating the grid insulating layer 14 and the inter-layer-medium layer 16. In some embodiments, the thin-film-transistor base plate may comprise a driving thin-film transistor and a switching thin-film transistor, and FIG. 1 shows merely the driving thin-film transistor.

According to an embodiment of the present disclosure, the material and the thickness of the planarization layer are not particularly limited, and a person skilled in the art may flexibly select the material of the planarization layer and the thickness of the planarization layer in conventional techniques according to actual situations. For example, the material of the planarization layer includes but is not limited to polyimide (PI); and the thickness of the planarization layer is 0.8 nm-1.5 nm.

According to an embodiment of the present disclosure, the light emitting devices comprise an anode, a luminescent layer and a cathode, and, certainly, may further comprise one or more of a hole transporting layer, a hole injection layer, an electron transporting layer, an electron injection layer and so on. In some embodiments, referring to FIG. 1, in the direction away from the thin-film-transistor base plate, the blue-color light emitting device 31 comprises the first anode 311, a first luminescent layer 312 and a first cathode 313 that are provided in stack, the red-color light emitting device 32 comprises the second anode 321, a second luminescent layer 322 and a second cathode 323 that are provided in stack, and the green-color light emitting device 33 comprises the third anode 331, a third luminescent layer 332 and a third cathode 333 that are provided in stack. Furthermore, as shown in FIG. 1, the first anode 311, the second anode 321 and the third anode 331 are electrically connected to the source-drain electrode 17 in the thin-film-transistor base plate by a via hole penetrating the planarization layer, to drive the light emitting devices to emit light.

Certainly, as shown in FIG. 1, the display panel may further comprise a pixel defining layer 50, the pixel defining layer 50 is provided on one side of the planarization layer 20 that is further away from the substrate base plate, and covers part of the edge of the anode (comprising the first anode, the second anode and the third anode), and the pixel defining layer 50 defines a plurality of openings, wherein the openings are the effective light emitting regions of the light emitting devices.

According to an embodiment of the present disclosure, the anode (comprising the first anode, the second anode and the third anode) comprises a transparent electrode, a silver electrode and a transparent electrode that are provided in stack. The material of the transparent electrode includes but is not limited to ITO, IZO and so on.

According to an embodiment of the present disclosure, the surface roughness Ra of the one surface of the first anode that is further away from the thin-film-transistor base plate is 1.6 nm-2.6 nm (for example, 1.6 nm, 1.7 nm, 1.8 nm, 1.9 nm, 2.0 nm, 2.1 nm, 2.2 nm, 2.3 nm, 2.4 nm, 2.5 nm and 2.6 nm), and the surface roughness Ra of the one surface of the second anode that is further away from the thin-film-transistor base plate is 1.6 nm-2.6 nm (for example, 1.6 nm, 1.7 nm, 1.8 nm, 1.9 nm, 2.0 nm, 2.1 nm, 2.2 nm, 2.3 nm, 2.4 nm, 2.5 nm and 2.6 nm). Accordingly, the first anode and the second anode have higher surface roughnesses, and when light irradiates the surfaces of the first anode and the second anode, the light rays are not reflected out by the surfaces of the first anode and the second anode collectively, which can increase the luminous efficiencies of the first anode of the blue-color light emitting device and the large angles of the red-color light emitting device, and reduce the color cast of the monochromatic light and the color cast of the white light, thereby ameliorating the problem of the large-angle color cast of the display panel. If the surface roughnesses of the first anode and the second anode are less than 1.6 nm, then the effect of the amelioration of the color cast of the display panel is poor. If the surface roughnesses of the first anode and the second anode are greater than 2.6 nm, because the surface roughnesses of the first anode and the second anode are too high, the uniformity of the subsequent structures such as the luminescent layer is affected, which in turn affects the light-emission effect of the blue-color light emitting device and the red-color light emitting device. It should be noted that the magnitudes of the surface roughnesses of the first anode and the second anode may be equal, and may also be different, which may be flexibly selected by a person skilled in the art.

According to an embodiment of the present disclosure, the surface roughness Ra of the one surface of the third anode that is further away from the thin-film-transistor base plate is 0.9 nm-1.1 nm (for example, 0.9 nm, 0.95 nm, 1.0 nm, 1.05 nm and 1.1 nm). Accordingly, the surface roughness of the third anode is relatively small, and the light emission amount of the green-color light emitting device at large visual angles is reduced, which increases the proportions of the blue light emitted by the blue-color light emitting device and the red light emitted by the red-color light emitting device in the white light, to achieve the goal of improving the large-visual-angle color cast.

According to an embodiment of the present disclosure, referring to FIG. 1, the display panel further comprises: a rough insulating layer 40, wherein the rough insulating layer 40 is provided on one surface of the planarization layer 20 that is further away from the thin-film-transistor base plate 10 (the rough insulating layer 40 is provided between, on one hand, the planarization layer 20 and, on the other hand, the first anode 311 and the second anode 321), the orthographic projection of the rough insulating layer 40 on the thin-film-transistor base plate 10 covers the orthographic projections of the first anode 311 and the second anode 321 on the thin-film-transistor base plate 10, and does not have an overlapping region with the orthographic projection of the third anode 331 on the thin-film-transistor base plate 10, the first anode 311 and the second anode 321 are provided on one surface of the rough insulating layer 40 that is further away from the thin-film-transistor base plate 10, and the third anode 331 is provided on the one surface of the planarization layer 20 that is further away from the thin-film-transistor base plate 10. The surface roughness of the one surface of the rough insulating layer 40 that is further away from the thin-film-transistor base plate is greater than the surface roughness of the one surface of the planarization layer 20 that is further away from the thin-film-transistor base plate. Accordingly, by providing the rough insulating layer 40, to enable the first anode and the second anode provided on its surface to have higher surface roughnesses, and providing the third anode of the green-color light emitting device directly on the one surface of the planarization layer having a lower surface roughness, to enable the third anode to have a lower surface roughness, an excellent light-emission effect of the green-color light emitting device is ensured, and the light emission amount of the green-color light emitting device at large visual angles is reduced, which increases the proportions of the blue light emitted by the blue-color light emitting device and the red light emitted by the red-color light emitting device in the white light, to achieve the goal of improving the large-visual-angle color cast.

It should be noted that, in the related art, the third anode in the green-color light emitting device is usually also provided on the one surface of the planarization layer that is further away from the thin-film-transistor base plate. Therefore, as compared with the related art, the surface roughness of the third anode is not changed.

According to an embodiment of the present disclosure, the surface roughness of the one surface of the rough insulating layer that is further away from the thin-film-transistor base plate is 1.0 nm-2.3 nm (for example, 1.0 nm, 1.2 nm, 1.4 nm, 1.6 nm, 1.8 nm, 2.0 nm, 2.2 nm and 2.3 nm). Accordingly, the first anode and the second anode, which are formed on the one surface of the rough insulating layer having such a surface roughness, have relatively high and suitable surface roughnesses. The surface roughness of the one surface of the planarization layer that is further away from the thin-film-transistor base plate is less than 1.0 nm (for example, 0.5 nm, 0.6 nm, 0.7 nm, 0.8 nm, 0.9 nm and 0.99 nm). Accordingly, by providing the third anode directly on the one surface of the planarization layer having a lower surface roughness, to enable the third anode to have a lower surface roughness, an excellent light-emission effect of the green-color light emitting device is ensured, and the light emission amount of the green-color light emitting device at large visual angles is reduced, which increases the proportions of the blue light emitted by the blue-color light emitting device and the red light emitted by the red-color light emitting device in the white light, to achieve the goal of improving the large-visual-angle color cast.

In some embodiments, the material of the rough insulating layer is silicon oxide, the thickness of the rough insulating layer is 200 nm-300 nm (for example, 200 nm, 210 nm, 220 nm, 230 nm, 240 nm, 250 nm, 260 nm, 270 nm, 280 nm, 290 nm and 300 nm), and the surface roughness of the silicon oxide is 1.0 nm-1.8 nm (for example, 1.0 nm, 1.1 nm, 1.2 nm, 1.3 nm, 1.4 nm, 1.5 nm, 1.6 nm, 1.7 nm and 1.8 nm). That can effectively meet the requirements on the surface roughnesses of the first anode and the second anode, and does not adversely affect the other structures of the light emitting devices.

According to an embodiment of the present disclosure, the material of the rough insulating layer is silicon oxide and silicon nitride (in other words, the rough insulating layer comprises a silicon-nitride layer and a silicon-oxide layer that are provided in stack), the thickness of the silicon oxide is 200 nm-300 nm (for example, 200 nm, 210 nm, 220 nm, 230 nm, 240 nm, 250 nm, 260 nm, 270 nm, 280 nm, 290 nm and 300 nm), the thickness of the silicon nitride is 80 nm-100 nm (for example, 80 nm, 85 nm, 90 nm, 95 nm and 100 nm), and the surface roughness of the rough insulating layer is 1.2 nm-2.3 nm (for example, 1.2 nm, 1.3 nm, 1.4 nm, 1.5 nm, 1.6 nm, 1.7 nm, 1.8 nm, 1.9 nm, 2.0 nm, 2.1 nm, 2.2 nm and 2.3 nm). That can effectively meet the requirements on the surface roughnesses of the first anode and the second anode, and does not adversely affect the other structures of the light emitting devices.

It should be noted that, when the rough insulating layer comprises a silicon-nitride layer and a silicon-oxide layer that are provided in stack, the order of the stacking is not particularly limited, and may be flexibly designed according to actual situations by a person skilled in the art. For example, the silicon-nitride layer may be provided closer to the first anode, and may also be provided further away from the first anode.

Figure 2:
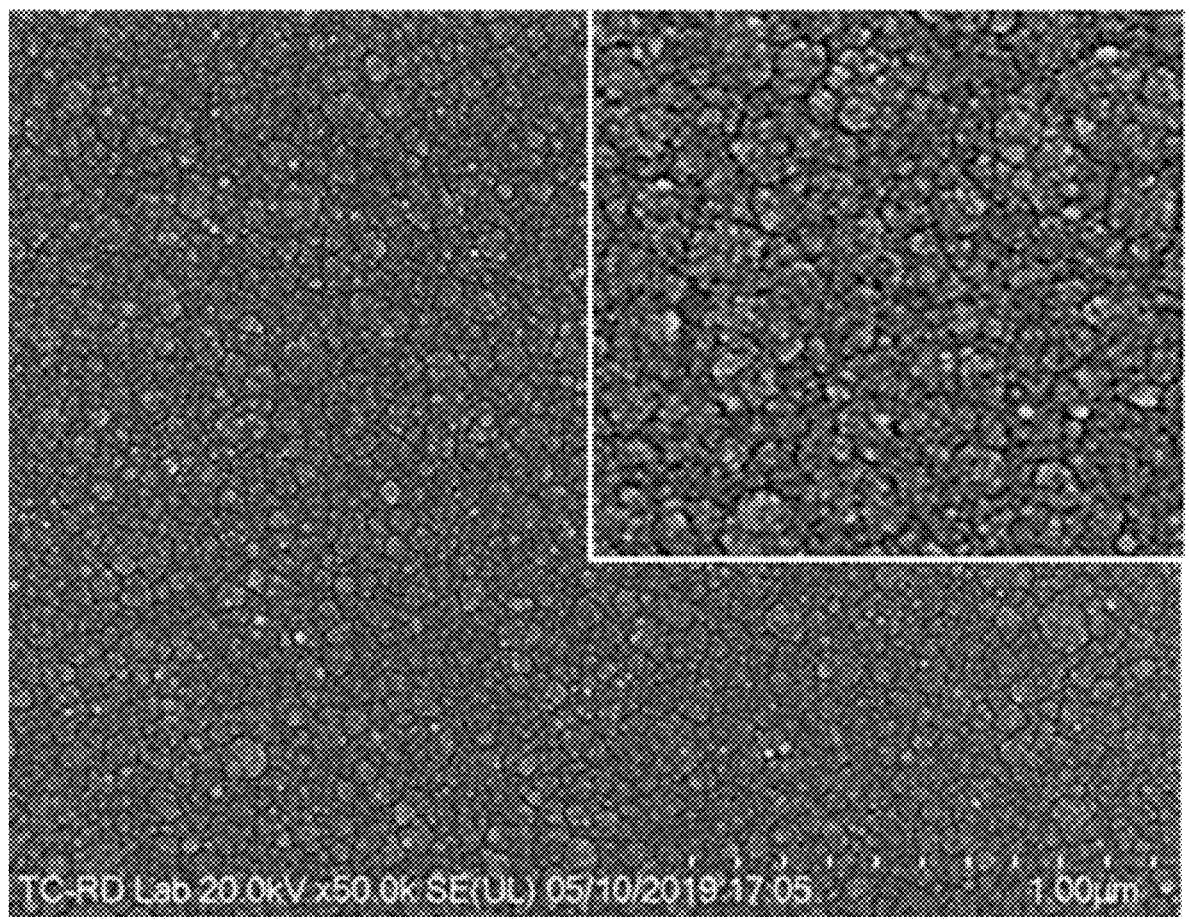
FIG. 2 is a scanning-electron-microscope diagram of the one surface of the rough insulating layer according to another embodiment of the present disclosure.
Figure 3A:
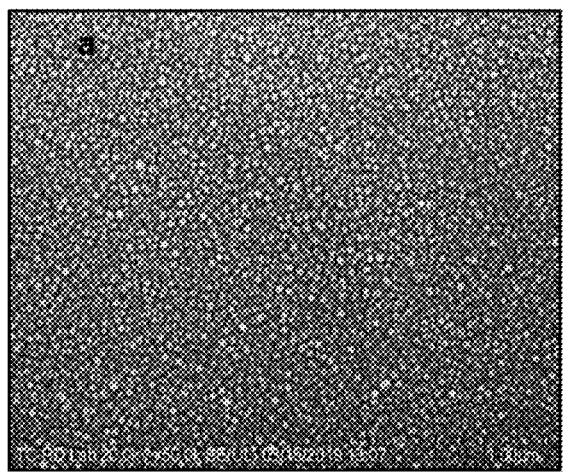
FIG. 3A is a scanning-electron-microscope diagram of the surfaces of the first anode and the second anode according to yet another embodiment of the present disclosure.
Figure 3B:
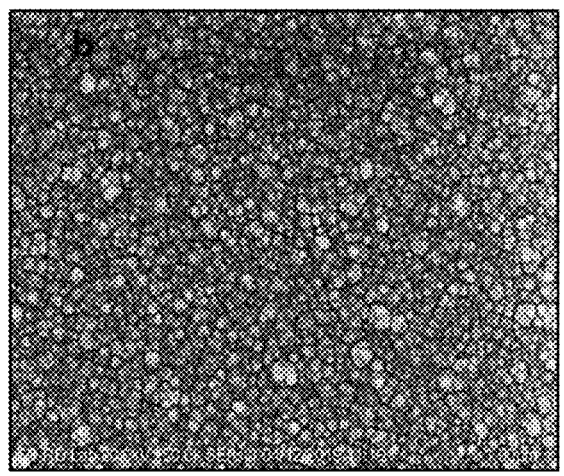
FIG. 3B is a scanning-electron-microscope diagram of the one surface of the third anode.
Figure 4A:
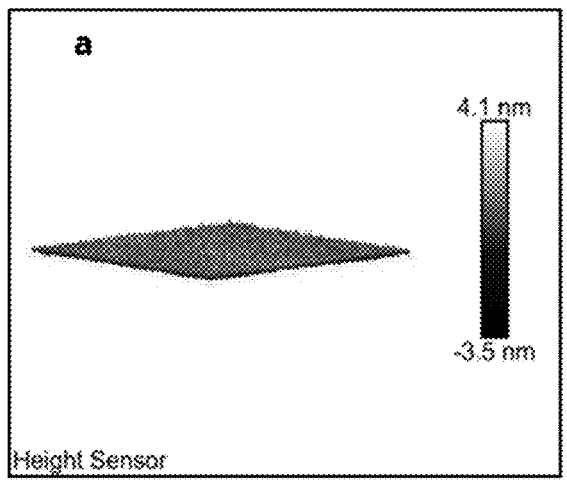
FIG. 4A is a test diagram obtained by Atomic Force Microscope (AFM) of the roughnesses of the first anode and the second anode according to yet another embodiment of the present disclosure.
Figure 4B:
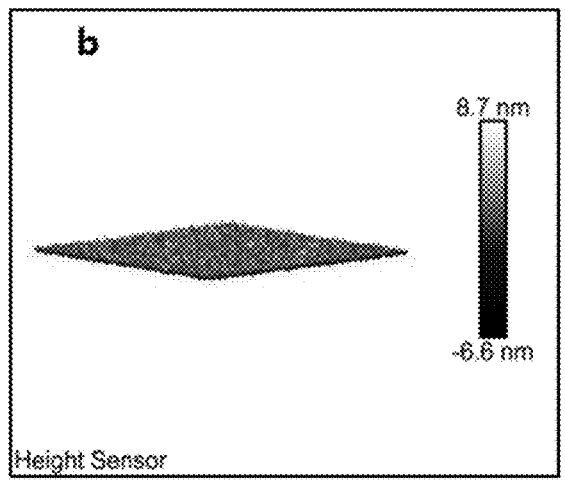
FIG. 4B is a test diagram obtained by Atomic Force Microscope (AFM) of the roughness of the third anode.

In some embodiments, the material of the rough insulating layer 40 is silicon oxide, and a scanning-electron-microscope diagram of its surface may refer to FIG. 2. The material of the planarization layer 20 is polyimide, and a scanning-electron-microscope diagram of the surfaces of the first anode and the second anode provided on the one surface of the planarization layer 20 may refer to FIG. 3A. A test diagram obtained by Atomic Force Microscope (AFM) of the roughnesses of the first anode and the second anode may refer to FIG. 4A. A scanning-electron-microscope diagram of the third anode provided on the one surface of the rough insulating layer 40 may refer to FIG. 3B, and a test diagram obtained by Atomic Force Microscope (AFM) of the roughness of the third anode may refer to FIG. 4B. It can be known from FIGS. 3 and 4 that, as compared with the third anode provided on the one surface of the planarization layer 20, the first anode and the second anode provided on the one surface of the rough insulating layer 40 have higher surface roughnesses.

Figure 5:
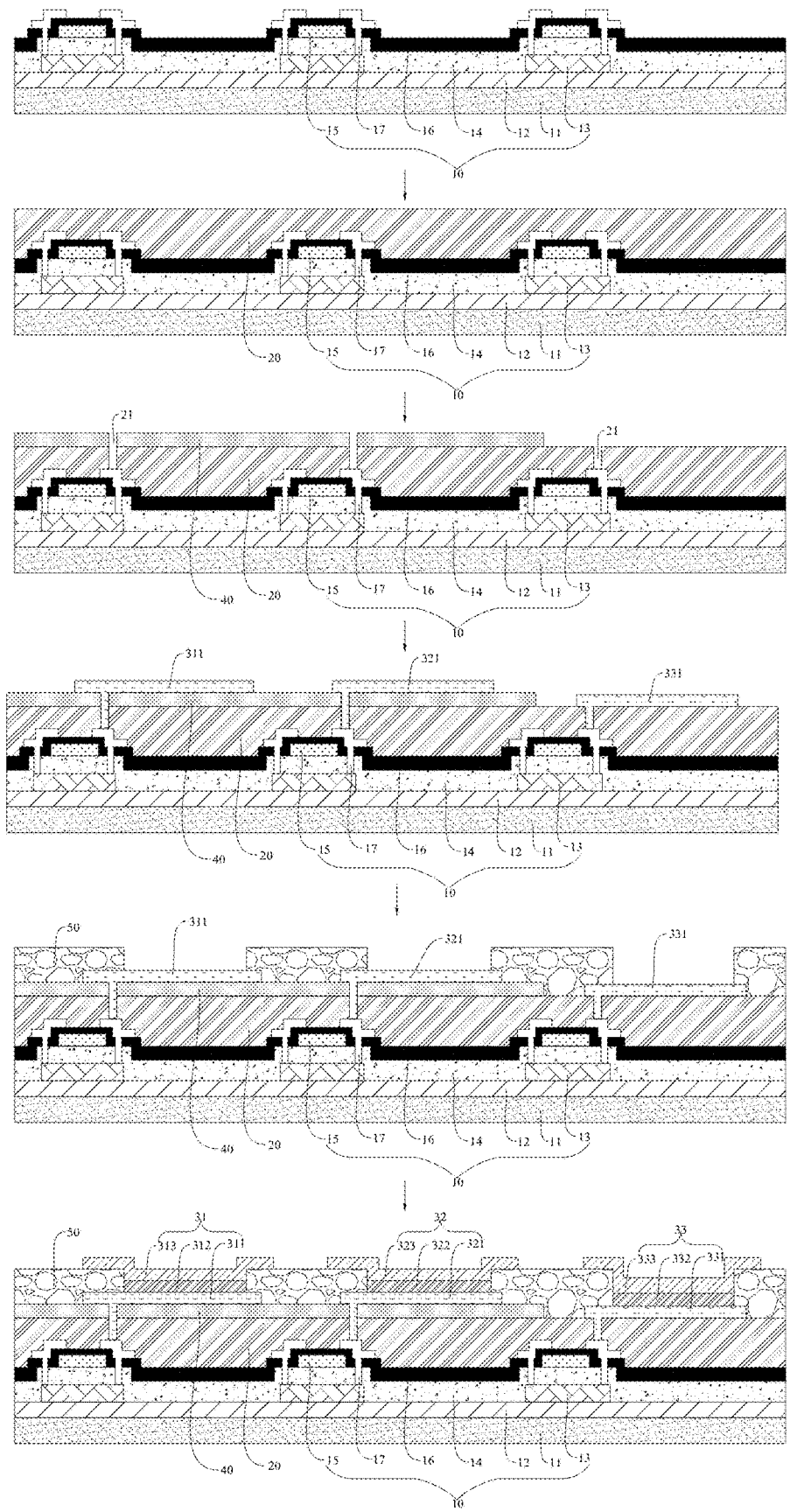
FIG. 5 is a schematic flow chart of the fabrication of the display panel according to yet another embodiment of the present disclosure.

In another aspect of the present disclosure, the present disclosure provides a method for fabricating the display panel stated above. According to an embodiment of the present disclosure, referring to FIG. 5, the method for fabricating a display panel comprises:

S100: providing the thin-film-transistor base plate 10.

The particular structure of the thin-film-transistor base plate 10 is not particularly limited, and may be flexibly selected according to actual situations by a person skilled in the art. In some embodiments, as shown in FIG. 1, the thin-film-transistor base plate 10 comprises: a substrate 11; a buffer layer 12, wherein the buffer layer 12 is provided on one surface of the substrate; an active layer 13, wherein the active layer 13 is provided on one side of the buffer layer that is further away from the substrate base plate; a grid insulating layer 14, wherein the grid insulating layer 14 is provided on sides of the buffer layer 12 and the active layer 13 that are further away from the substrate 11; a grid 15, wherein the grid 15 is provided on one side of the grid insulating layer 14 that is further away from the substrate 11; an inter-layer-medium layer 16, wherein the inter-layer-medium layer 16 is provided on sides of the grid insulating layer 14 and the grid 15 that are further away from the substrate 11; and a source-drain electrode 17, wherein the source-drain electrode 17 is provided on one side of the inter-layer-medium layer 16 that is further away from the substrate 11, and is electrically connected to the active layer 13 by a via hole penetrating the grid insulating layer 14 and the inter-layer-medium layer 16. In some embodiments, the thin-film-transistor base plate may comprise a driving thin-film transistor and a switching thin-film transistor, and FIG. 1 shows merely the driving thin-film transistor.

S200: forming a planarization layer 20 on the one surface of the thin-film-transistor base plate 10.

The method of forming the planarization layer is not particularly limited, and a person skilled in the art may flexibly select the method and the conditions of the formation of the planarization layer in conventional techniques according to actual situations. For example, the planarization layer may be obtained by spread-coating, leveling and solidifying polyimide, wherein the fabrication temperature (or referred to as solidification temperature) of the planarization layer PLN is approximately 250° C.

According to an embodiment of the present disclosure, the material and the thickness of the planarization layer are not particularly limited, and a person skilled in the art may flexibly select the material of the planarization layer and the thickness of the planarization layer in conventional techniques according to actual situations. For example, the material of the planarization layer includes but is not limited to polyimide (PI); and the thickness of the planarization layer is 0.8 nm-1.5 nm.

S300: forming light emitting devices on the one side of the planarization layer 20 that is further away from the thin-film-transistor base plate, wherein the light emitting devices include a blue-color light emitting device 31, a red-color light emitting device 32 and a green-color light emitting device 33, the blue-color light emitting device 31 comprises a first anode 311, the red-color light emitting device 32 comprises a second anode 321, and the green-color light emitting device 33 comprises a third anode 331. A schematic structural diagram of the fabricated display panel may refer to FIG. 1, wherein both of the surface roughness of one surface of the first anode 311 that is further away from the thin-film-transistor base plate 10 and the surface roughness of one surface of the second anode 321 that is further away from the thin-film-transistor base plate 10 are greater than the surface roughness of one surface of the third anode 331 that is further away from the thin-film-transistor base plate 10.

According to an embodiment of the present disclosure, referring to FIG. 2, the method for fabricating a display panel further comprises: before forming the light emitting devices, forming a rough insulating layer 40 on the one surface of the planarization layer 20 that is further away from the thin-film-transistor base plate in advance, and the orthographic projection of the rough insulating layer 40 on the thin-film-transistor base plate 10 covers the orthographic projections of the first anode 311 and the second anode 321 on the thin-film-transistor base plate 10, and does not have an overlapping region with the orthographic projection of the third anode 331 on the thin-film-transistor base plate 10, the first anode 311 and the second anode 321 are formed on the one surface of the rough insulating layer 40 that is further away from the thin-film-transistor base plate 10, and the third anode 331 is formed on the one surface of the planarization layer 20 that is further away from the thin-film-transistor base plate 10. The surface roughness of the one surface of the rough insulating layer 40 that is further away from the thin-film-transistor base plate 10 is greater than the surface roughness of the one surface of the planarization layer 20 that is further away from the thin-film-transistor base plate. Accordingly, by providing the rough insulating layer 40, to enable the first anode and the second anode provided on its surface to have higher surface roughnesses, and providing the third anode of the green-color light emitting device directly on the one surface of the planarization layer having a lower surface roughness, to enable the third anode to have a lower surface roughness, an excellent light-emission effect of the green-color light emitting device is ensured.

In some embodiments, the step of forming the rough insulating layer 40 may comprise: forming a whole original rough insulating layer on the one surface of the planarization layer 20 that is further away from the thin-film-transistor base plate; then, by using a wet-etching process, removing the original rough insulating layer at a position where the green-color light emitting device is required to be formed; and maintaining the original rough insulating layer at positions where the blue-color light emitting device and the red-color light emitting device are required to be formed, to obtain the rough insulating layer. A person skilled in the art can understand that, because the anodes (including the first anode, the second anode and the third anode) are required to be electrically connected to the source-drain electrode 17 by a via hole 21, the via hole 21 penetrating the planarization layer and the rough insulating layer may, after the formation of the rough insulating layer, be formed by one-step etching.

According to an embodiment of the present disclosure, the rough insulating layer is obtained by depositing silicon oxide, and the rate of the deposition of the silicon oxide is 50 angstroms/second to 100 angstroms/second, for example, 50 angstroms/second, 60 angstroms/second, 70 angstroms/second, 80 angstroms/second, 90 angstroms/second and 100 angstroms/second. Accordingly, the rough insulating layer having the required surface roughness and thickness can be obtained. In some embodiments, the thickness of the fabricated rough insulating layer is 200 nm-300 nm, and the surface roughness of the silicon oxide is 1.0 nm-1.8 nm. That can effectively meet the requirements on the surface roughnesses of the first anode and the second anode, and does not adversely affect the other structures of the light emitting devices.

According to an embodiment of the present disclosure, the rough insulating layer is obtained by depositing silicon oxide and silicon nitride, the rate of the deposition of the silicon oxide is 50 angstroms/second to 100 angstroms/second, for example, 50 angstroms/second, 60 angstroms/second, 70 angstroms/second, 80 angstroms/second, 90 angstroms/second and 100 angstroms/second, and the rate of the deposition of the silicon nitride is 800 angstroms/second to 1000 angstroms/second, for example, 800 angstroms/second, 850 angstroms/second, 900 angstroms/second, 950 angstroms/second and 1000 angstroms/second. Accordingly, the rough insulating layer having the required surface roughness and thickness can be obtained. In some embodiments, the fabricated rough insulating layer comprises a silicon-nitride layer and a silicon-oxide layer that are provided in stack, the thickness of the silicon-oxide layer is 200 nm-300 nm, the thickness of the silicon-nitride layer is 80 nm-100 nm, and the surface roughness of the rough insulating layer is 1.2 nm-2.3 nm. That can effectively meet the requirements on the surface roughnesses of the first anode and the second anode, and does not adversely affect the other structures of the light emitting devices.

Optionally, the particular method of forming the rough insulating layer by deposition may comprise chemical vapor deposition (for example, plasma enhanced chemical vapor deposition PECVD) or physical vapor deposition (for example, magnetron sputtering method).

According to an embodiment of the present disclosure, the first anode of the fabricated blue-color light emitting device and the second anode of the red-color light emitting device have higher surface roughnesses, and when light irradiates the surfaces of the first anode and the second anode, the light rays are not reflected out by the surfaces of the first anode and the second anode collectively, which can increase the luminous efficiencies of the first anode of the blue-color light emitting device and the large angles of the red-color light emitting device, and reduce the color cast of the monochromatic light and the color cast of the white light, thereby ameliorating the problem of the large-angle color cast of the display panel.

In yet another aspect of the present disclosure, the present disclosure provides a displaying device. According to an embodiment of the present disclosure, the displaying device comprises the display panel stated above. Accordingly, the problem of the large-visual-angle color cast of the display panel is effectively ameliorated. A person skilled in the art can understand that the displaying device has all of the characteristics and the advantages of the display panel stated above, which are not discussed here in further detail.

According to an embodiment of the present disclosure, the particular type of the displaying device is not particularly limited, and may be flexibly selected according to actual situations by a person skilled in the art. In some embodiments, the particular type of the displaying device includes but is not limited to all of displaying devices that have the function of displaying, such as a mobile phone, a notebook computer, a kindle, an iPad, a television set and a game machine.

A person skilled in the art can understand that the displaying device, besides the display panel stated above, further comprises the structures or components necessary for conventional displaying devices. Taking a mobile phone as an example, besides the display panel stated above, it further comprises the necessary structures or components such as a glass cover plate, a battery rear cover, a middle frame, a mainboard, a touch-controlling module, an audio module and a shooting module.

EXAMPLE

Figure 6:
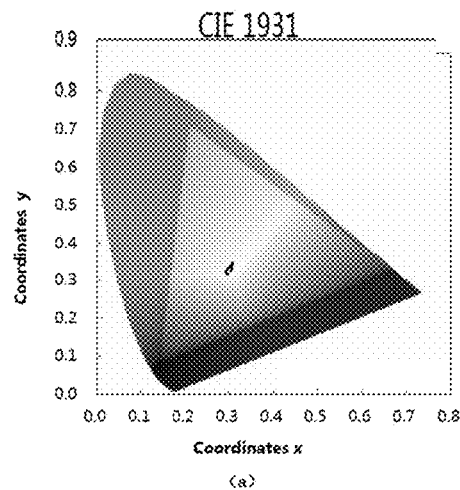
FIG. 6 is test diagrams of the chromaticity-coordinate trajectory and the color cast of the display panel according to an example of the present disclosure.
Figure 6:
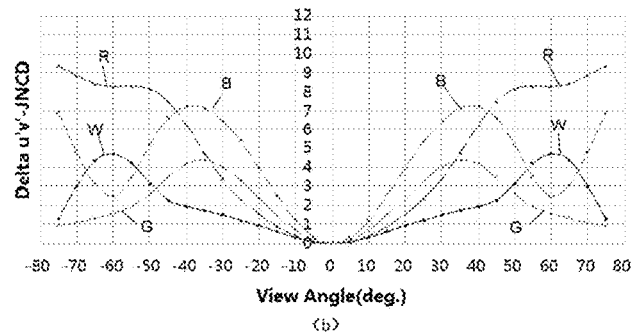

A schematic structural diagram of a display panel refers to FIG. 1. The first anode of the blue-color light emitting device and the second anode of the red-color light emitting device are provided on one surface of the rough insulating layer 40, and the third anode of the green-color light emitting device is provided on one surface of the planarization layer 20. The test diagrams of the chromaticity-coordinate trajectory and the color cast of the display panel refer to FIG. 6a and FIG. 6b respectively, wherein in the test diagram of the color cast on the right of FIG. 6, R represents the color-cast curve of the red color, B represents the color-cast curve of the blue light, G represents the color-cast curve of the green light, and W represents the color-cast curve of the white light.

Comparative Example 1

Figure 7:
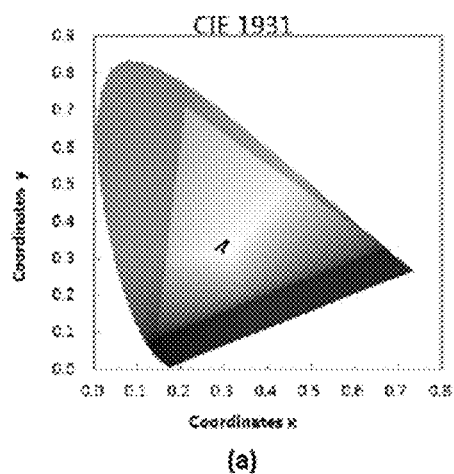
FIG. 7 is test diagrams of the chromaticity-coordinate trajectory and the color cast of the display panel in the comparative example 1.
Figure 7:
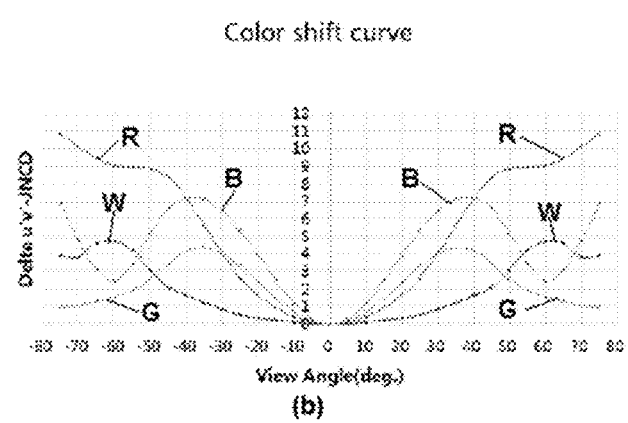

The structure of the display panel of this comparative example differs from that of the above example in that the first anode of the blue-color light emitting device is provided on one surface of the rough insulating layer 40, and the second anode of the red-color light emitting device and the third anode of the green-color light emitting device are provided on one surface of the planarization layer 20. The test diagrams of the chromaticity-coordinate trajectory and the color cast of the display panel refer to FIG. 7a and FIG. 7b respectively.

Comparative Example 2

Figure 8:
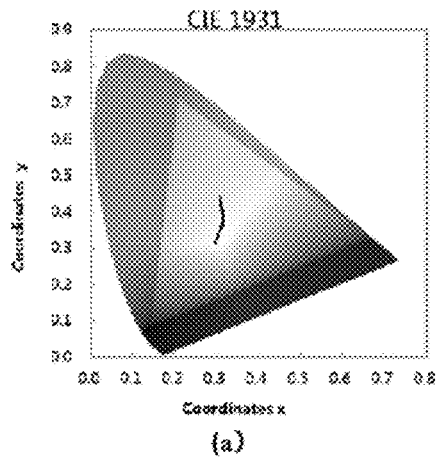
FIG. 8 is test diagrams of the chromaticity-coordinate trajectory and the color cast of the display panel in the comparative example 2.
Figure 8:
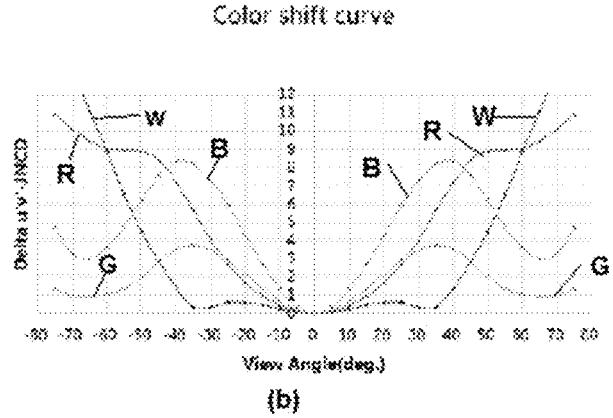

The structure of the display panel of this comparative example differs from that of the above example in that the third anode of the green-color light emitting device is provided on one surface of the rough insulating layer 40, and the second anode of the red-color light emitting device and the first anode of the blue-color light emitting device are provided on one surface of the planarization layer 20. The test diagrams of the chromaticity-coordinate trajectory and the color cast of the display panel refer to FIG. 8a and FIG. 8b respectively.

Comparative Example 3

Figure 9:
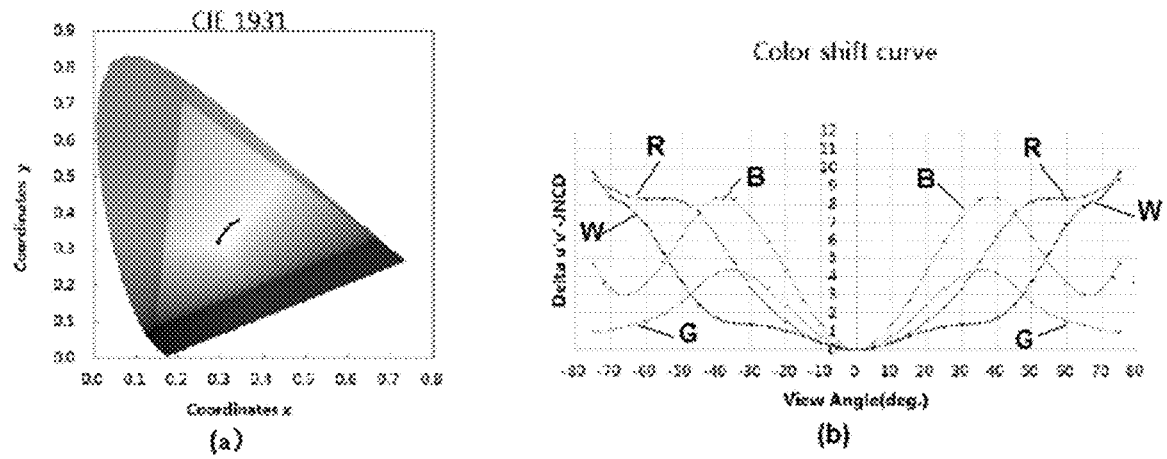
FIG. 9 is test diagrams of the chromaticity-coordinate trajectory and the color cast of the display panel in the comparative example 3.

The structure of the display panel of this comparative example differs from that of the above example in that the second anode of the red-color light emitting device is provided on one surface of the rough insulating layer 40, and the third anode of the green-color light emitting device and the first anode of the blue-color light emitting device are provided on one surface of the planarization layer 20. The test diagrams of the chromaticity-coordinate trajectory and the color cast of the display panel refer to FIG. 9a and FIG. 9b respectively.

Comparative Example 4

Figure 10:
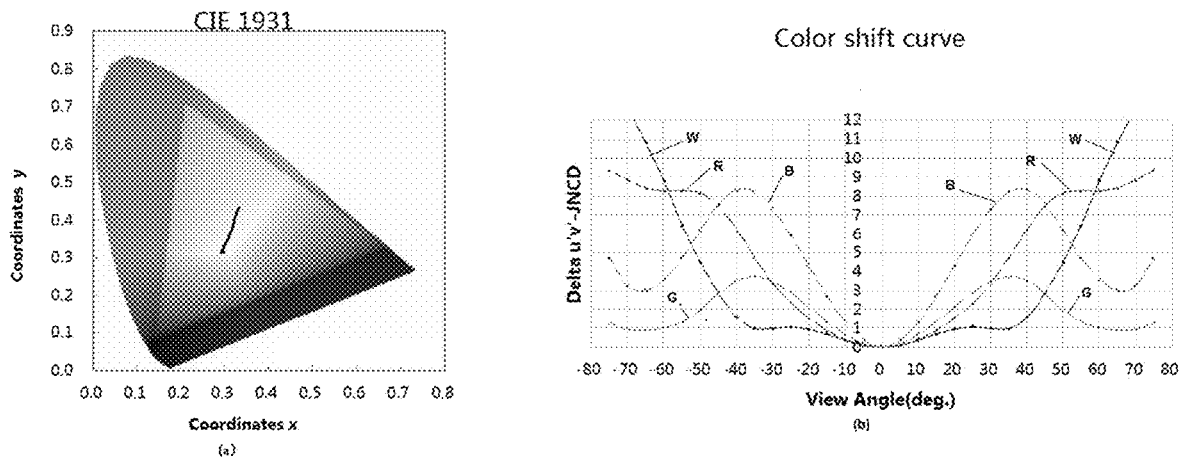
FIG. 10 is test diagrams of the chromaticity-coordinate trajectory and the color cast of the display panel in the comparative example 4.

The structure of the display panel of this comparative example differs from that of the above example in that the second anode of the red-color light emitting device and the third anode of the green-color light emitting device are provided on one surface of the rough insulating layer 40, and the first anode of the blue-color light emitting device is provided on one surface of the planarization layer 20. The test diagrams of the chromaticity-coordinate trajectory and the color cast of the display panel refer to FIG. 10a and FIG. 10b respectively.

Comparative Example 5

Figure 11:
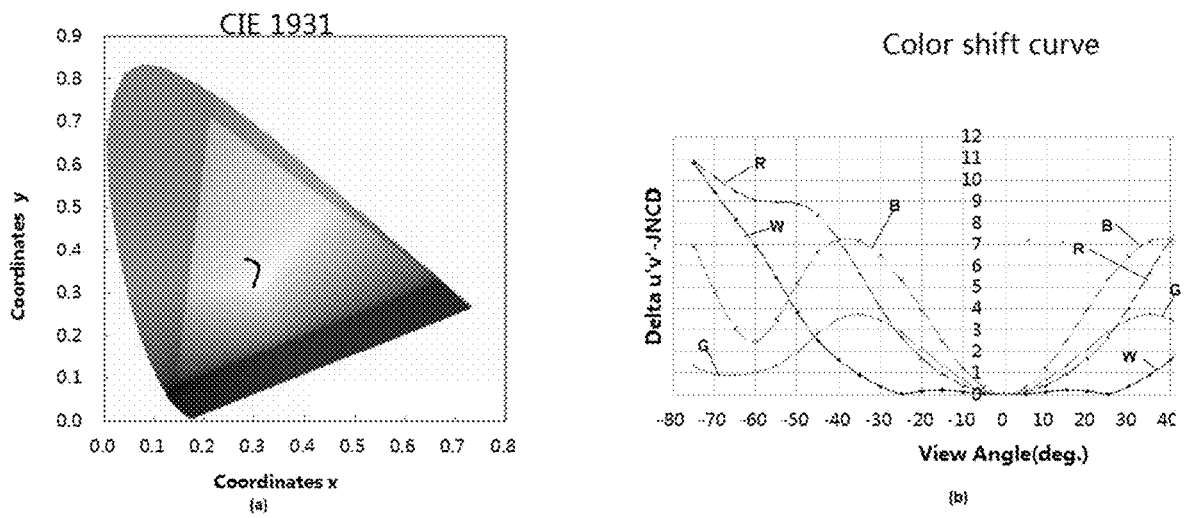
FIG. 11 is test diagrams of the chromaticity-coordinate trajectory and the color cast of the display panel in the comparative example 5.

The structure of the display panel of this comparative example differs from that of the above example in that the first anode of the blue-color light emitting device and the third anode of the green-color light emitting device are provided on one surface of the rough insulating layer 40, and the second anode of the red-color light emitting device is provided on one surface of the planarization layer 20. The test diagrams of the chromaticity-coordinate trajectory and the color cast of the display panel refer to FIG. 11a and FIG. 11b respectively.

Comparative Example 6

Figure 12:
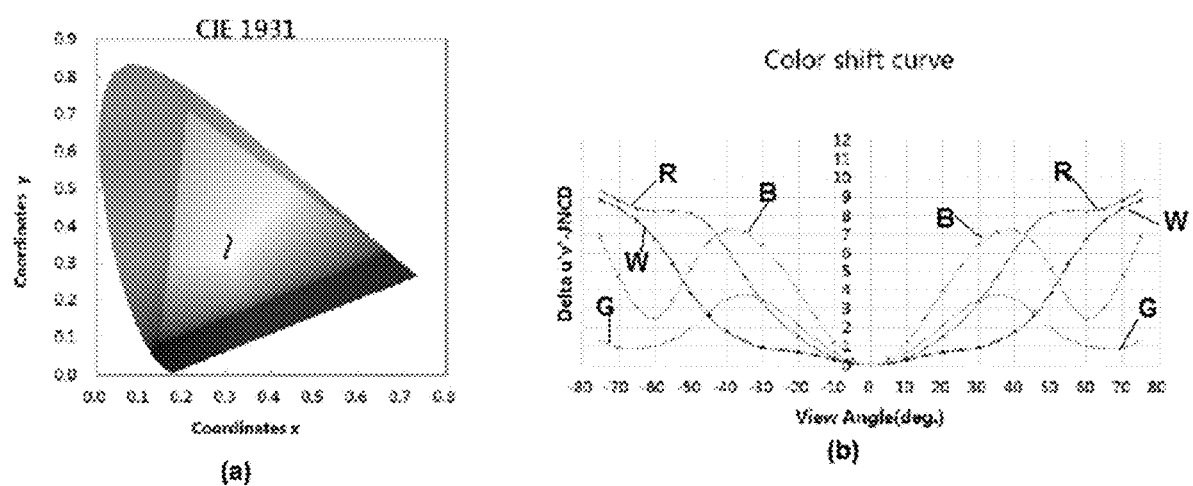
FIG. 12 is test diagrams of the chromaticity-coordinate trajectory and the color cast of the display panel in the comparative example 6.

The structure of the display panel of this comparative example differs from that of the above example in that: all of the first anode of the blue-color light emitting device, the second anode of the red-color light emitting device and the third anode of the green-color light emitting device are provided on one surface of the rough insulating layer 40. The test diagrams of the chromaticity-coordinate trajectory and the color cast of the display panel refer to FIG. 12a and FIG. 12b respectively.

In the above example and the comparative examples 1-6, the material of the rough insulating layer 40 is silicon oxide, and a scanning-electron-microscope diagram of its surface may refer to FIG. 2. The material of the planarization layer 20 is polyimide, and a scanning-electron-microscope diagram of the surfaces of the first anode and the second anode provided on the one surface of the planarization layer 20 may refer to FIG. 3A. A test diagram obtained by Atomic Force Microscope (AFM) of the roughnesses of the first anode and the second anode may refer to FIG. 4A. A scanning-electron-microscope diagram of the third anode provided on the one surface of the rough insulating layer 40 may refer to FIG. 3B, and a test diagram obtained by Atomic Force Microscope (AFM) of the roughness of the third anode may refer to FIG. 4B. It can be known from FIGS. 3 and 4 that, as compared with the third anode provided on the one surface of the planarization layer 20, the first anode and the second anode provided on the one surface of the rough insulating layer 40 have higher surface roughnesses.

From the test diagrams of the chromaticity-coordinate trajectories and the color casts of the above example and the comparative examples 1-6, it can be known that the large-visual-angle color cast of the display panel according to the above example has been greatly ameliorated.

In the description of the present disclosure, the description referring to the terms "an embodiment", "some embodiments", "example", "particular example" or "some examples" and so on means that particular features, structures, materials or characteristics described with reference to the embodiment or example are comprised in at least one of the embodiments or examples of the present disclosure. In the description, the illustrative expressions of the above terms do not necessarily relate to the same embodiment or example. Furthermore, the described particular features, structures, materials or characteristics may be combined in one or more embodiments or examples in a suitable form. Furthermore, subject to avoiding contradiction, a person skilled in the art may combine different embodiments or examples described in the description and the features of the different embodiments or examples.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Although the embodiments of the present disclosure have already been illustrated and described above, it can be understood that the above embodiments are illustrative, and should not be construed as a limitation on the present disclosure, and a person skilled in the art may make variations, modifications, substitutions and improvements to the above embodiments within the scope of the present disclosure.

The invention claimed is:

1. A display panel, wherein the display panel comprises:
a thin-film-transistor base plate;
a planarization layer, wherein the planarization layer is provided on one surface of the thin-film-transistor base plate; and
light emitting devices, wherein the light emitting devices are provided on one side of the planarization layer that is further away from the thin-film-transistor base plate, the light emitting devices include a blue-color light emitting device, a red-color light emitting device and a green-color light emitting device, the blue-color light emitting device comprises a first anode, the red-color light emitting device comprises a second anode, and the green-color light emitting device comprises a third anode;
wherein both of a surface roughness of one surface of the first anode that is further away from the thin-film-transistor base plate and a surface roughness of one surface of the second anode that is further away from the thin-film-transistor base plate are greater than a surface roughness of one surface of the third anode that is further away from the thin-film-transistor base plate.

2. The display panel according to claim 1, wherein the surface roughness of the one surface of the first anode that is further away from the thin-film-transistor base plate is 1.6 nm-2.6 nm, the surface roughness of the one surface of the second anode that is further away from the thin-film-transistor base plate is 1.6 nm-2.6 nm, and the surface roughness of the one surface of the third anode that is further away from the thin-film-transistor base plate is 0.9 nm-1.1 nm.

3. The display panel according to claim 1, wherein the display panel further comprises:
a rough insulating layer, wherein the rough insulating layer is provided on one surface of the planarization layer that is further away from the thin-film-transistor base plate, an orthographic projection of the rough insulating layer on the thin-film-transistor base plate covers orthographic projections of the first anode and the second anode on the thin-film-transistor base plate, and does not have an overlapping region with an orthographic projection of the third anode on the thin-film-transistor base plate, the first anode and the second anode are provided on one surface of the rough insulating layer that is further away from the thin-film-transistor base plate, and the third anode is provided on the one surface of the planarization layer that is further away from the thin-film-transistor base plate.

4. The display panel according to claim 3, wherein a surface roughness of the one surface of the rough insulating layer that is further away from the thin-film-transistor base plate is greater than a surface roughness of the one surface of the planarization layer that is further away from the thin-film-transistor base plate.

5. The display panel according to claim 4, wherein the surface roughness of the one surface of the rough insulating layer that is further away from the thin-film-transistor base plate is 1.0 nm-2.3 nm, and the surface roughness of the one surface of the planarization layer that is further away from the thin-film-transistor base plate is less than 1.0 nm.

6. The display panel according to claim 5, wherein a material of the rough insulating layer is silicon oxide, a thickness of the rough insulating layer is 200 nm-300 nm, and a surface roughness of the silicon oxide is 1.0 nm-1.8 nm.

7. The display panel according to claim 5, wherein a material of the rough insulating layer is silicon oxide and silicon nitride, a thickness of the silicon oxide is 200 nm-300 nm, a thickness of the silicon nitride is 80 nm-100 nm, and a surface roughness of the rough insulating layer is 1.2 nm-2.3 nm.

8. The display panel according to claim 3, wherein part of the rough insulating layer has one side that contacts the planarization layer and one other side that contacts a pixel defining layer.

9. The display panel according to claim 8, wherein the rough insulating layer and the third anode are separated by the pixel defining layer.

10. The display panel according to claim 1, wherein the display panel further comprises a first cathode, a second cathode and a third cathode, and upper surfaces of the first cathode, the second cathode and the third cathode are flush.

11. A method for fabricating the display panel according to claim 1, wherein the method comprises:
providing the thin-film-transistor base plate;
forming the planarization layer on the one surface of the thin-film-transistor base plate; and forming the light emitting devices on the one side of the planarization layer that is further away from the thin-film-transistor base plate.

12. The method according to claim 11, wherein before the step of forming the light emitting devices on the one side of the planarization layer that is further away from the thin-film-transistor base plate, the method further comprises:
forming a rough insulating layer on one surface of the planarization layer that is further away from the thin-film-transistor base plate, wherein an orthographic projection of the rough insulating layer on the thin-film-transistor base plate covers orthographic projections of the first anode and the second anode on the thin-film-transistor base plate, and does not have an overlapping region with an orthographic projection of the third anode on the thin-film-transistor base plate;
the first anode and the second anode are formed on one surface of the rough insulating layer that is further away from the thin-film-transistor base plate, and the third anode is formed on the one surface of the planarization layer that is further away from the thin-film-transistor base plate; and
a surface roughness of the one surface of the rough insulating layer that is further away from the thin-film-transistor base plate is greater than a surface roughness of the one surface of the planarization layer that is further away from the thin-film-transistor base plate.

13. The method according to claim 12, wherein the step of forming the rough insulating layer on the one surface of the planarization layer that is further away from the thin-film-transistor base plate comprises:
forming a whole original rough insulating layer on the one surface of the planarization layer that is further away from the thin-film-transistor base plate;
by using a wet-etching process, removing the original rough insulating layer at a position where the green-color light emitting device is required to be formed; and
maintaining the original rough insulating layer at positions where the blue-color light emitting device and the red-color light emitting device are required to be formed, to obtain the rough insulating layer.

14. The method according to claim 12, wherein the rough insulating layer is obtained by depositing silicon oxide, and a rate of the deposition of the silicon oxide is 50 angstroms/second to 100 angstroms/second.

15. The method according to claim 12, wherein the rough insulating layer is obtained by depositing silicon oxide and silicon nitride, a rate of the deposition of the silicon oxide is 50 angstroms/second to 100 angstroms/second, and a rate of the deposition of the silicon nitride is 800 angstroms/second to 1000 angstroms/second.

16. The method according to claim 12, wherein the rough insulating layer is formed by chemical vapor deposition or physical vapor deposition.

17. The method according to claim 12, wherein after the step of forming the rough insulating layer on the one surface of the planarization layer that is further away from the thin-film-transistor base plate, the method further comprises:
by one-step etching, forming a via hole penetrating the planarization layer and the rough insulating layer.

18. The method according to claim 11, wherein planarization layer is obtained by spread-coating, leveling and solidifying polyimide, wherein the fabrication temperature of the planarization layer is 250° C.

19. A displaying device, wherein the displaying device comprises the display panel according to claim 1.

* * * * *